(12) United States Patent
Wu et al.

(10) Patent No.: US 12,243,880 B2
(45) Date of Patent: Mar. 4, 2025

(54) DISPLAY PANEL AND DISPLAY APPARATUS

(71) Applicants:WUHAN TIANMA MICROELECTRONICS CO., LTD., Wuhan (CN); Wuhan Tianma Microelectronics Co., Ltd. Shanghai Branch, Shanghai (CN)

(72) Inventors: Yingying Wu, Wuhan (CN); Peng Zhang, Wuhan (CN)

(73) Assignees: Wuhan Tianma Microelectronics Co., Ltd. Shanghai Branch, Shanghai (CN); Wuhan Tianma Microelectronics Co., Ltd., Wuhan (CN)

( * ) Notice: Subject to any disclaimer, the term of this patent is extended or adjusted under 35 U.S.C. 154(b) by 473 days.

(21) Appl. No.: 17/828,922

(22) Filed: May 31, 2022

(65) Prior Publication Data

US 2022/0293639 A1     Sep. 15, 2022

(30) Foreign Application Priority Data

Mar. 29, 2022   (CN) .......................... 202210320435.9

(51) Int. Cl.
*H01L 27/12* (2006.01)
*H01L 23/00* (2006.01)

(52) U.S. Cl.
CPC .......... *H01L 27/1248* (2013.01); *H01L 24/05* (2013.01); *H01L 24/06* (2013.01); *H01L 2224/05073* (2013.01); *H01L 2224/05562* (2013.01); *H01L 2224/05573* (2013.01); *H01L 2224/06155* (2013.01)

(58) Field of Classification Search
CPC ..... H01L 27/1248; H01L 24/05; H01L 24/06; H01L 2224/05073; H01L 2224/05562; H01L 2224/05573; H01L 2224/06155; H01L 27/124; H10K 59/131
USPC .......................................................... 257/91
See application file for complete search history.

(56) References Cited

U.S. PATENT DOCUMENTS

2021/0357007 A1*  11/2021  Zhang ................... G06F 1/1637

FOREIGN PATENT DOCUMENTS

| CN | 106973496 A | 7/2017 |
|----|-------------|--------|
| CN | 208903231 U | 5/2019 |
| CN | 210349147 U | 4/2020 |

* cited by examiner

*Primary Examiner* — Tong-Ho Kim
(74) *Attorney, Agent, or Firm* — Christensen O'Connor Johnson Kindness PLLC

(57) ABSTRACT

A display panel and a display apparatus are provided. The display panel includes a substrate, binding pins provided at a side of the substrate, and insulating layers. The substrate has a display region and a binding region that are arranged along a first direction. The binding pins are arranged along a second direction and are located in the binding region of the substrate. The insulating layers and the binding pins are arranged on a same side of the substrate. At least one insulating layer includes at least one first aperture provided at a side of the binding region away from the display region. An orthographic projection of the first aperture on the substrate overlaps with an orthographic projection of the binding pin on the substrate in the first direction.

23 Claims, 17 Drawing Sheets

DISPLAY PANEL AND DISPLAY APPARATUS

CROSS-REFERENCE TO RELATED APPLICATION

The present application claims priority to Chinese Patent Application No. 202210320435.9, filed on Mar. 29, 2022, the content of which is incorporated herein by reference in its entirety.

TECHNICAL FIELD

The present disclosure relates to the field of display technologies, and, particularly, relates to a display panel and a display apparatus.

BACKGROUND

With increasing display requirements of consumers, the full-screen display has become a research focus. The full-screen display has a high screen-to-body ratio, which can greatly improve the user experience.

When realizing full-screen display, since abundant signal lines, circuits and the like are provided at a lower border of the display panel, the design of the lower border is an important topic. In the related art, cracking and warping of at least one layer occur in the lower border of the full-screen, which causes binding pins close to an edge of the lower border to bear the brunt.

SUMMARY

In a first aspect of the present disclosure, a display panel is provided. The display panel includes a substrate, a plurality of binding pins, and a plurality of insulating layers. The substrate has a display region and a binding region that are arranged along a first direction. The plurality of binding pins is provided on a side of the substrate and located in the binding region of the substrate, and the first direction intersects with the second direction. The plurality of insulating layers arranged on a same side of the substrate as the plurality of binding pins. The at least one insulating layer of the plurality of insulating layers each includes at least one first aperture provided at a side of the binding region away from the display region. An orthographic projection of one of the at least one first aperture on the substrate overlaps with an orthographic projection of one of the plurality of binding pins on the substrate in the first direction.

In a second aspect of the present disclosure, a display apparatus is provided. The display apparatus includes a display panel. The display panel includes a substrate, a plurality of binding pins, and a plurality of insulating layers. The substrate has a display region and a binding region that are arranged along a first direction. The plurality of binding pins is provided on a side of the substrate and located in the binding region of the substrate, and the first direction intersects with the second direction. The plurality of insulating layers arranged on a same side of the substrate as the plurality of binding pins. The at least one insulating layer of the plurality of insulating layers each includes at least one first aperture provided at a side of the binding region away from the display region. An orthographic projection of one of the at least one first aperture on the substrate overlaps with an orthographic projection of one of the plurality of binding pins on the substrate in the first direction.

BRIEF DESCRIPTION OF DRAWINGS

In order to better illustrate technical solutions of embodiments of the present disclosure, the accompanying drawings used in embodiments are briefly described below. The drawings described below are merely a part of the embodiments of the present disclosure. Based on these drawings, those skilled in the art can obtain other drawings.

DESCRIPTION OF EMBODIMENTS

In order to better understand the technical solutions of the present disclosure, the embodiments of the present disclosure are described in detail below with reference to the accompanying drawings.

It should be clear that the described embodiments are only some embodiments of the present disclosure, but not all of the embodiments. Based on the embodiments in the present disclosure, other embodiments obtained by those of ordinary skill in the art fall within the protection scope of the present disclosure.

The terms used in the embodiments of the present disclosure are only for the purpose of describing specific embodiments, and are not intended to limit the present disclosure. As used in the embodiments of this application and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there can be three relationships, for example, A and/or B, which can indicate that A alone, A and B, and B alone. The character "l" in this document generally indicates that the related objects are an "or" relationship.

In the present disclosure, it should be understood that words such as "basically", "approximately", "about", "substantially" and "generally" described in the claims and embodiments of the present disclosure refer to a value within a reasonable technological operating ranges or tolerance ranges, which can be generally approved and is not a precise value.

It should be understood that although the terms 'first', 'second' and 'third' can be used in the present disclosure to describe signal lines and pins, these signal lines and pins should not be limited to these terms. These terms are used only to distinguish signal lines and pins from each other. For example, without departing from the scope of the embodiments of the present disclosure, a first signal line can also be referred to as a second signal line. Similarly, the second signal line can also be referred to as the first signal line.

Figure 1:
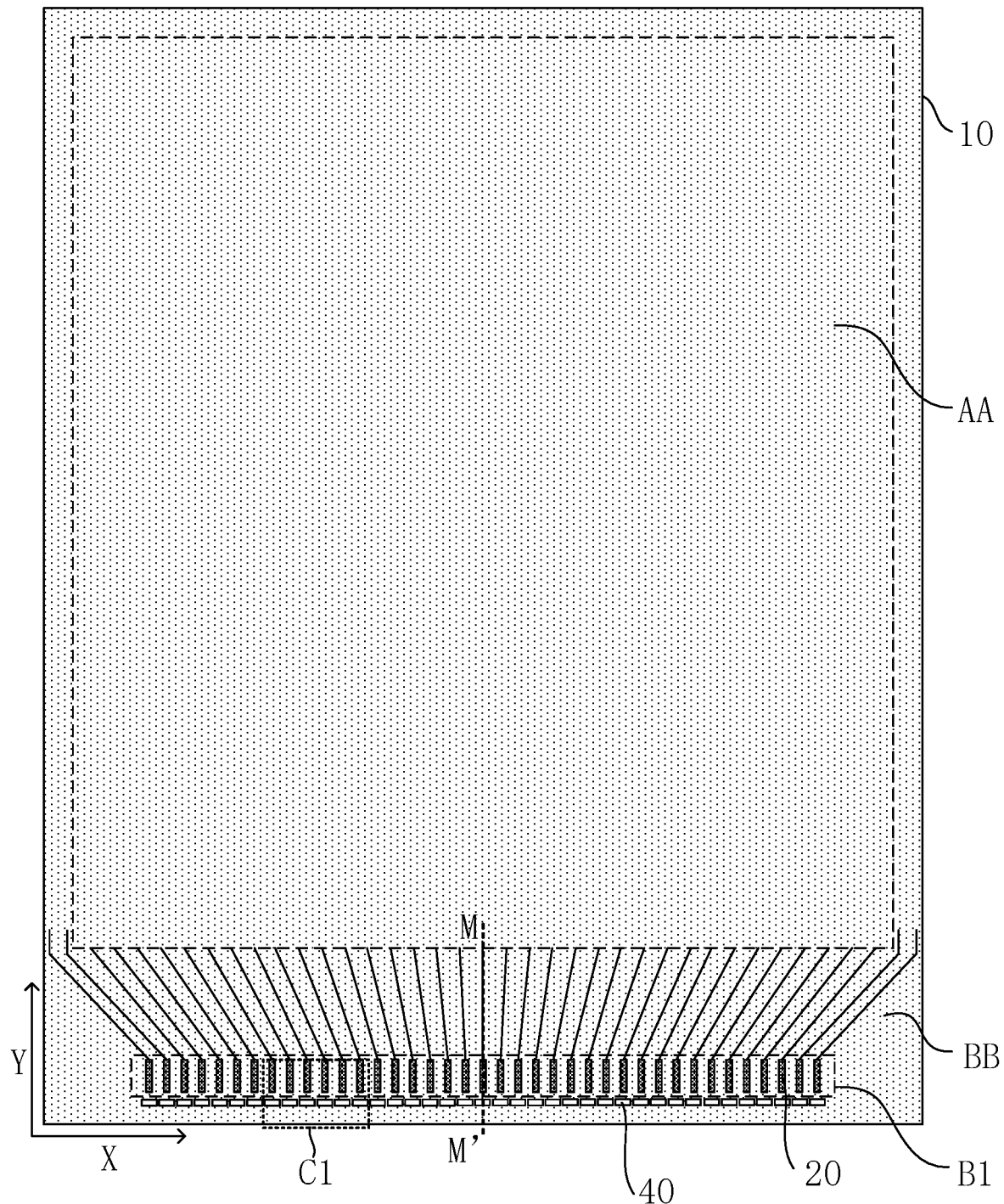
FIG. 1 is a schematic diagram of a display panel according to some embodiments of the present disclosure.
Figure 2:
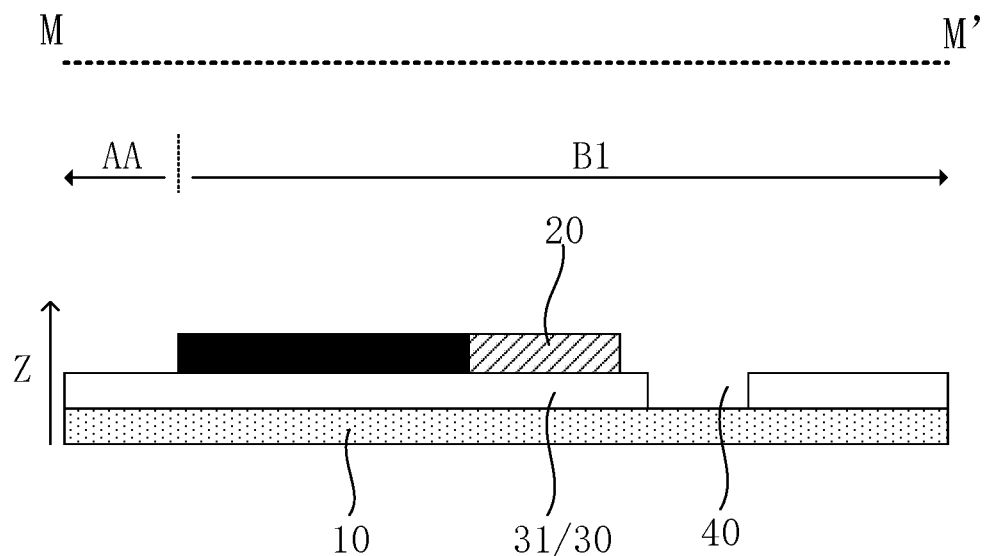
FIG. 2 is a partial cross-sectional view along line MM' shown in FIG. 1 according to some embodiments of the present disclosure.

FIG. 1 is a schematic diagram of a display panel according to some embodiments of the present disclosure, and FIG. 2 is a partial cross-sectional view along line MM' shown in FIG. 1 according to some embodiments of the present disclosure.

Referring to FIG. 1 and FIG. 2, the display panel includes a substrate 10. The substrate 10 has a display region AA and a binding region B1. Exemplarily, the substrate 10 includes a non-display region BB surrounding the display AA. The binding region B1 is provided in the non-display region BB. Multiple pixels are provided in the display region AA and configured to display images. Multiple binding pins 20 are provided in the binding region B1 and configured to be bound to an integrated circuit board or a flexible circuit board.

The display region AA and the binding region B1 are arranged along a first direction Y. In some embodiments, after the binding pins 20 are bound to the integrated circuit board, the binding pins 20 can transmit signals between the integrated circuit board and pixels. In other embodiments, after the binding pins 20 are bound to the flexible circuit board, the binding pins 20 can transmit signals between the flexible circuit board and touch electrode.

The binding pins 20 are provided on a side of the substrate 10 and located in the binding region B1 of the substrate 10. Multiple binding pins 20 in the binding region B1 are arranged along a second direction X. The first direction Y intersects with the second direction X. For example, as shown in FIG. 1, the first direction Y can be perpendicular to the second direction X.

The display panel includes multiple insulating layers 30 that are provided at a same side of the substrate 10 as the binding pins 20. Exemplarily, only one insulating layer 30 is shown in FIG. 2, and an actual display panel can include multiple insulating layers 30.

At least one insulating layer 30 of the multiple insulating layers in the display panel includes a first aperture 40 provided at a side of the binding region B1 away from the display region AA. There is at least one first aperture 40 in the insulating layer 30. The first aperture 40 is provided at a side of the binding region B1 away from the display region AA, so that an orthographic projection of the first apertures 40 on the substrate 10 is located at a side of an orthographic projection of the binding pin 20 on the substrate 10 away from the display region AA.

In some embodiments of the present disclosure, the orthographic projection of the first aperture 40 on the substrate 10 overlaps with the orthographic projection of the binding pin 20 on the substrate 10 in the first direction Y. That is, along the first direction Y, the orthographic projection of the first aperture 40 on the substrate 10 overlaps with the orthographic projection of the binding pin 20 on the substrate 10.

When the display panel is bound to the integrated circuit board or the flexible circuit board, or when a pressure test and temperature shock test are performed on the display panel, and after a mother board is cut to form a display panel, the insulating layer close to the binding region B1 can be cracked and warped, which results in cracking and warping of the binding pins 20 and thus results in staggering after the binding. In display panels with narrow borders, the above problems are more prominent.

In a process of analyzing the above problems, when cracking and warping occur in the insulating layer 30 close to the binding region B1, cracking and warping also occur close to the edge of the display panel, and are also continuous same as the cracking and warping close to the binding region B1. Therefore, it can be deduced that the starting position of cracking and warping of the insulating layer 30 close to the binding region B1 is actually located at the edge of the display panel.

In the embodiments of the present disclosure, by providing the first aperture 40 in the insulating layer 30 provided in the region of the binding pin 20 away from the display region AA, when cracking and warping in the region of the insulating layer 20 corresponding to the edge of the display panel extend toward the binding region B1, the cracking and warping of the insulating layer 30 can be stopped at the first aperture 40. That is, a path of the cracking and warping of the region of the insulating layer 30 corresponding to the edge of the display panel, extending toward the binding pins 20 through a side of the binding pins close to the edge of the display panel, is cut off. Meanwhile, if a path of the cracking and warping of the insulating layer 30 extends from the edge region of the display panel to the inside, the pass can bypass the first aperture 40. That is, the extending path of the cracking and warping of the insulating layer 30 is lengthened before reaching the binding pins 20, so that the probability of cracking and warping of the insulating layer 30 reaching the binding pins 20 is greatly reduced.

The first aperture 40 in the display panel can block the warping at the edge of the display panel from extending toward the binding pin 20, so that the flatness of the binding pin 20 can be achieved, thereby improving the yield of binding between the display panel and the integrated circuit board/the flexible circuit board.

As can be seen from the above analysis of the technical problems, the cracking and warping of the insulating layer 30 are caused by the uniform binding pressure and uniform cutting stress in the vicinity of the binding pins 20 in the binding region. With the configuration where the first apertures 40 are provided close to the binding pins 20 and the starting position of the cracking and warping, the cracking and warping can be avoided.

In some embodiments, the insulating layer 30 in which the first aperture 40 is provided can be an insulating layer extending from the display region AA to the non-display region BB, and can include a portion provided in the binding region B1.

In some embodiments of the present disclosure, referring to FIG. 2, in a direction Z perpendicular to a plane of the display panel, at least one insulating layer 30 including the first aperture 40 is an inorganic layer and is located between the substrate 10 and a layer of the binding pin 20.

Exemplarily, as shown in FIG. 2, the insulating layer 31/30 is provided between the substrate 10 and a layer of the binding pin 20 and is an inorganic insulating layer and includes the first aperture 41/40.

After analyzing the problem of warping of the insulating layer 30 close to the binding region B1, it can be concluded that the warping layer is in the inorganic insulating layer. In some embodiments of the present disclosure, the first aperture 40 is provided in the inorganic insulating layer where the binding pins 20 is located can improve the yield of binding between the display panel and the integrated circuit board/the flexible circuit board.

Figure 3:
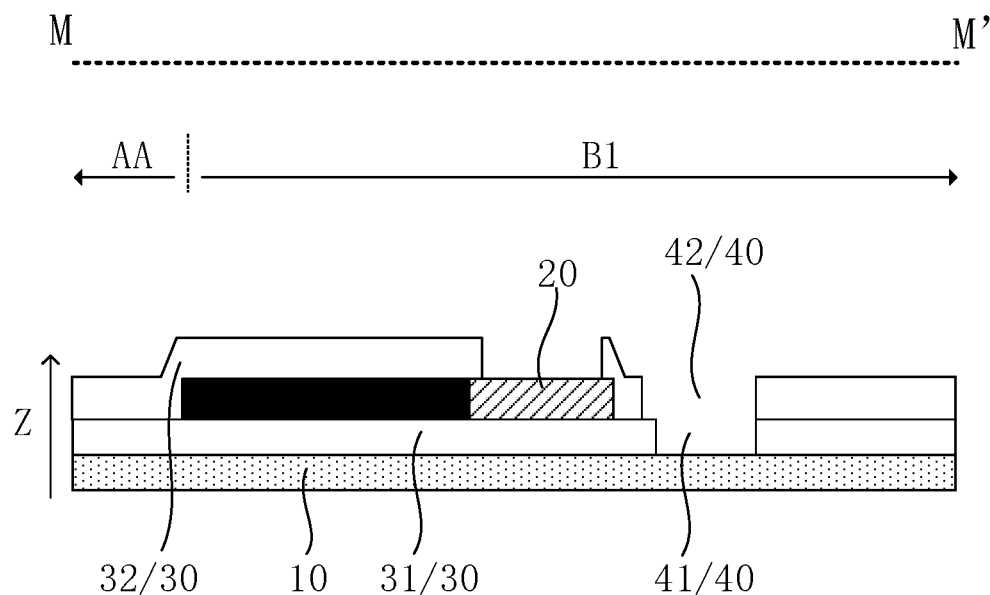
FIG. 3 is a partial cross-sectional view along line MM' shown in FIG. 1 according to other embodiments of the present disclosure.

FIG. 3 is a partial cross-sectional view along line MM' shown in FIG. 1 according to other embodiments of the present disclosure.

In some embodiments of the present disclosure, referring to FIG. 3, at least two insulating layers 30 in the display panel each include a first aperture 40, and in a direction Z perpendicular to a plane of the display panel, the first apertures 40 located in different insulating layers 30 overlap with each other.

Exemplarily, as shown in FIG. 3, multiple insulating layers 30 include a first insulating layer 31/30 and a second insulating layer 32/30, the insulating layer 31/30 includes a first aperture 41/40, and the insulating layer 32/30 includes a first aperture 42/40. Along a thickness direction Z of the display panel, the first aperture 41/40 overlaps with the first aperture 42/40. That is, the first aperture 41/40 communicates with the second aperture 42/40 along the thickness direction Z of the display panel.

In some embodiments, the first apertures 40 are provided in more insulating layers 30, which can block the warping at the edge of the display panel from extending toward the binding pins 20.

In some embodiments, referring to FIG. 3, among at least two insulating layers 30 including the first apertures 40, at least one of the at least two insulating layers 30 is located between the substrate 10 and a layer of the binding pin 20, and at least one of the at least two insulating layers 20 is located at a side of a layer of the binding pin 20 away from the substrate.

Exemplarily, as shown in FIG. 3, the insulating layer 31/30 including the first aperture 41/40 is located between the substrate 10 and a layer of the binding pin 20, and the insulating layer 32/30 including the first aperture 42/40 is located at a side of a layer of the binding pin 20 away from the substrate 10.

In the embodiments, the first apertures 40 are provided in the insulating layers 30 above and under the layer of the binding pin 20, respectively. On the one hand, the first aperture 40 is provided in the insulating layer 30 under the layer of the binding pin 20, so that the binding pin 20 has a flat bearing surface. On another hand, the first aperture 40 is provided in the insulating layer 30 above the layer of the binding pin 20, so that when cracking and warping occur in the insulating layer 30 fixed to the integrated circuit board/the flexible circuit board due to uneven bonding stress, the cracking and warping of the insulating layer 30 under the layer of the binding pin 20 can be avoided and cracking and warping of the binding pins 20 can be avoided.

In some embodiments of the present disclosure, as shown in FIG. 2 and FIG. 3, the binding pin 20 can be formed by a portion of a conductive layer.

Figure 4:
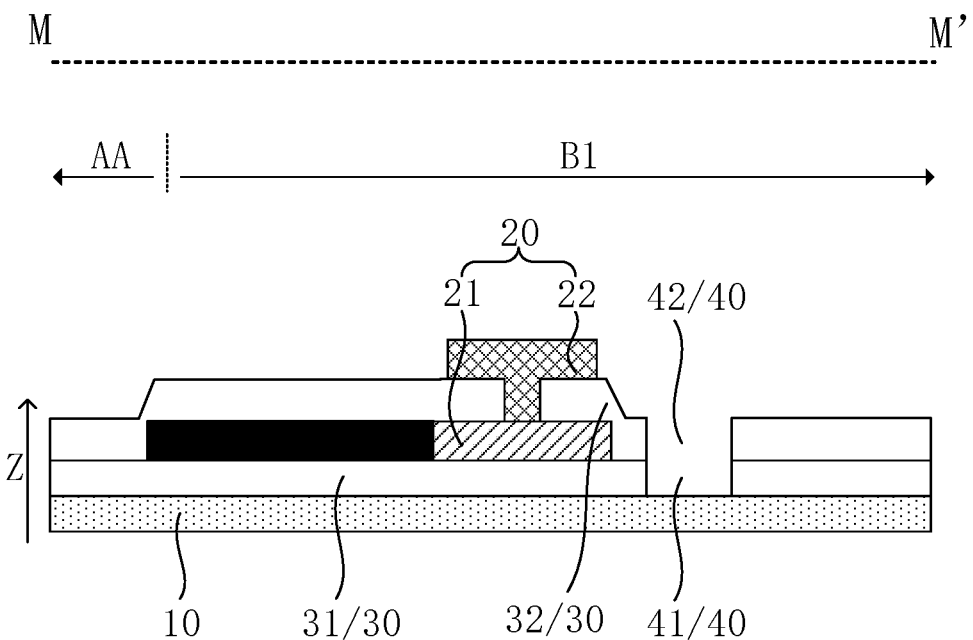
FIG. 4 is a partial cross-sectional view along line MM' shown in FIG. 1 according to other embodiments of the present disclosure.

FIG. 4 is a partial cross-sectional view along line MM' shown in FIG. 1 according to other embodiments of the present disclosure.

In other embodiments of the present disclosure, as shown in FIG. 4, the binding pin 20 can be formed by portions respectively located in at least two conductive layers. Exemplarily, as shown in FIG. 4, the binding pin 20 includes a first portion 21 located in one conductive layer and a second portion 22 located in another conductive layer.

In some embodiments, as shown in FIG. 4, along a thickness direction Z of the display panel, an insulating layer 32/30 is located between the first portion 21 and the second portion 22 that form the binding pin 20. In some embodiments, the insulating layer 32/30 includes the first aperture 42/40, and in the direction Z perpendicular to a plane of the display panel, the first aperture 42/40 in the insulating layer 32/30 can overlap with the first apertures 40 in another insulating layer 30.

Figure 5:
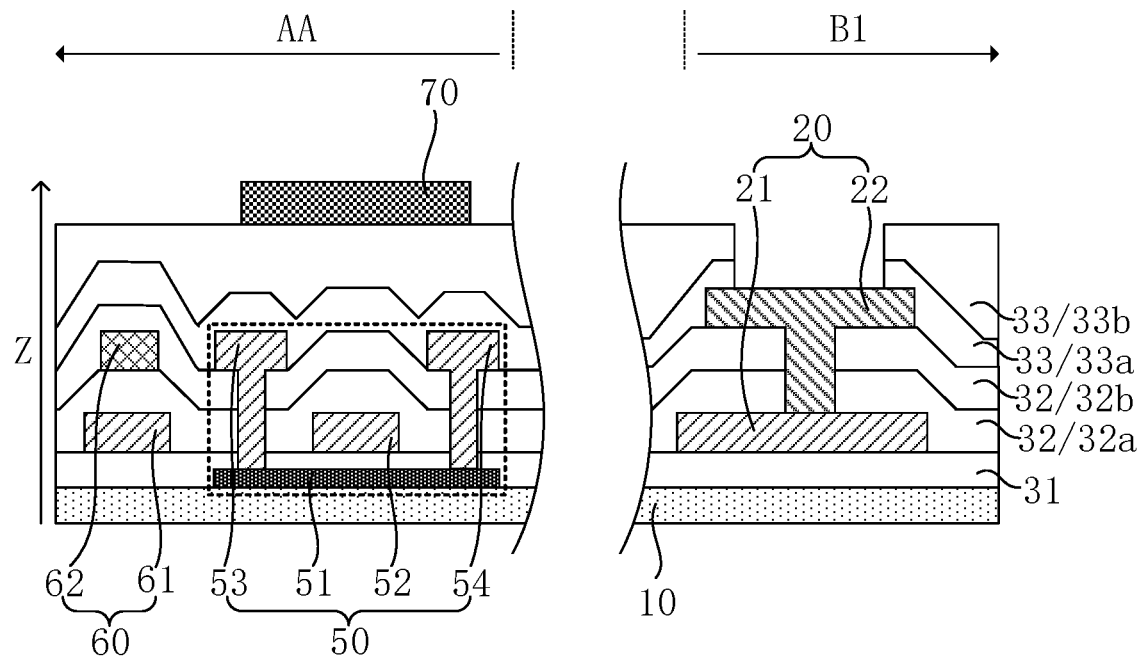
FIG. 5 is a schematic diagram of a display panel according to other embodiments of the present disclosure.

FIG. 5 is a schematic diagram of a display panel according to some embodiments of the present disclosure.

As shown in FIG. 5, a transistor 50, a capacitor 60, and a light-emitting device 70 are provided at a side of the substrate 10. In some embodiments, the substrate 10 can include signal lines and other devices.

Referring to FIG. 5, the transistor 50 includes a semiconductor layer 51, a gate 52, a source 53, and a drain 54. The capacitor includes a first electrode plate 61 and a second electrode plate 62. The source 53 and the drain 54 can be arranged in a same layer. The first electrode plate 61 of the capacitor can be arranged in a same layer as the drain electrode 54 and one of the gate 52 and the source 53. The second electrode plate 62 can be arranged in a different layer from each of the gate 52, the source 53, or the drain 54.

As shown in FIG. 5, an intermediate insulating layer 32/32a is located between the first electrode plate 61 and the second electrode plate 62, the gate insulating layer 31/30 is located between the semiconductor layer 51 and the gate 52, an interlayer dielectric layer 32/32b is located between the second electrode plate 62 and one of the gate 52 or located between the second electrode plate 62 and the source 53/the drain 54. A passivation layer 33/33a and a planarization layer 33/33b are located between the capacitor 60/the transistor 50 and the light-emitting device 70.

In some embodiments of the present disclosure, when the binding pin 20 is formed by a portion of a conductive layer, this portion can be provided in a same layer as any one of the gate 52, the source 53, the drain 54, and the second electrode plate 62.

Exemplarily, referring to FIG. 2 and FIG. 5, the binding pin 20 can be provided in a same layer as the gate 52.

In some embodiments of the present disclosure, when the binding pin 20 is formed by portions in at least two conductive layers, one of the at least two conductive layers can include any one of the gate 52, the source 53, the drain 54, and the second electrode plate 62, and another one of the at least two conductive layers can also include any one of the gate 52, the source 53, the drain 54, and the second electrode plate 62.

Exemplarily, referring to FIG. 3 and FIG. 5, the first portion 21 of the binding pin 20 is provided in a same layer as the gate 52, and the second portion 22 is provided in a same layer as the second electrode plate 62.

Exemplarily, referring to FIG. 5, the first portion 21 of the binding pin 20 is provided in a same layer as the gate 52, and the second portion 22 is provided in a same layer as the source 53 or the drain 54.

In some embodiments, the insulating layer 30 including the first aperture 40 is at least one of the gate insulating layer 31/30, the intermediate insulating layer 32/32a, the interlayer dielectric layer 32/32b, the passivation layer 33/33a, or the planarization layer 33/33b.

Figure 6:
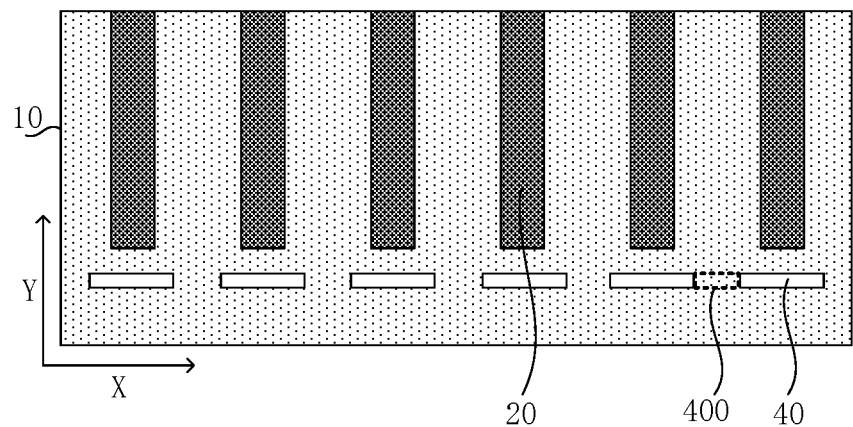
FIG. 6 is a partial enlarged view of a C1 region shown in FIG. 1 according to some embodiments of the present disclosure.
Figure 7:
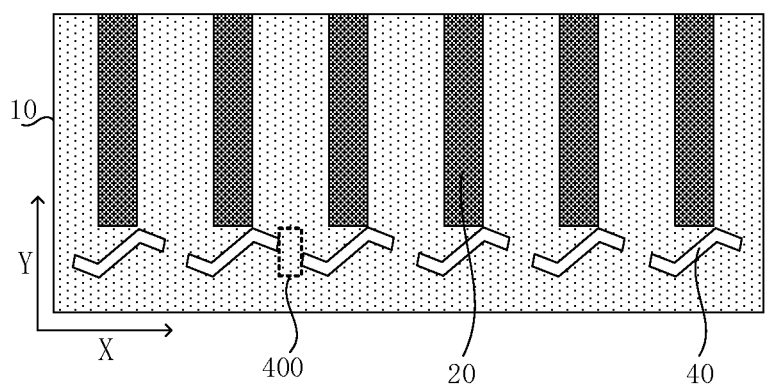
FIG. 7 is a partial enlarged view of the C1 region shown in FIG. 1 according to other embodiments of the present disclosure.
Figure 8:
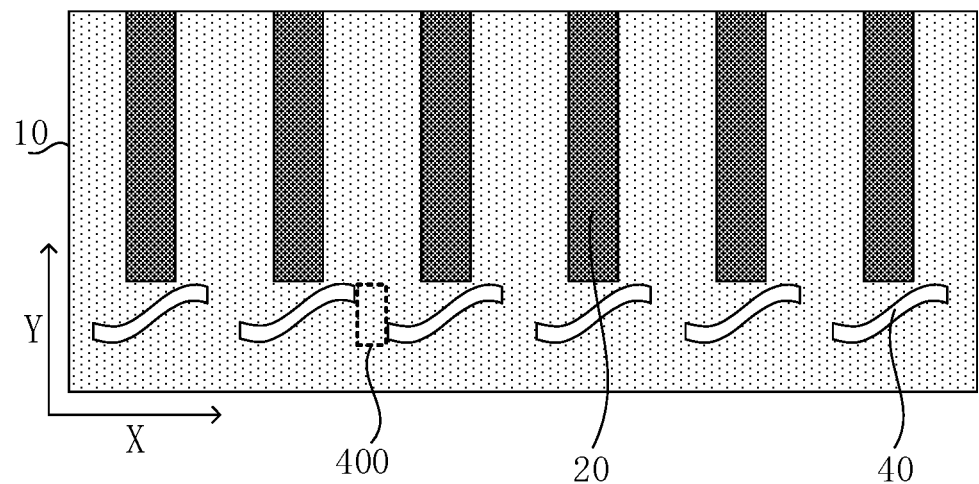
FIG. 8 is a partial enlarged view of the C1 region shown in FIG. 1 according to other embodiments of the present disclosure.

FIG. 6 is a partial enlarged view of the C1 region shown in FIG. 1 according to some embodiments of the present disclosure, FIG. 7 is a partial enlarged view of the C1 region shown in FIG. 1 according to other embodiments of the present disclosure, and FIG. 8 is a partial enlarged view of the C1 region shown in FIG. 1 according to other embodiments of the present disclosure.

In some embodiments of the present disclosure, as shown in FIG. 6 to FIG. 9, at least one insulating layer 30 of the multiple insulating layers 30 includes multiple first apertures 40 arranged along a second direction X, and an orthographic projection of a gap 400 between adjacent first apertures 40 along the second direction on the substrate 10 are located between orthographic projections of adjacent binding pins 20 on the substrate 10.

In a process of patterning the conductive layer, the residue of the conductive layer is likely to be generated in and around the first aperture 40. In the embodiments of the present disclosure, along the first direction Y, the binding pin 20 overlaps with the first aperture 40, and a part of a region between adjacent binding pins 20 does not overlap with the first aperture 40, so that the probability generating the residue of the conductive layer between the adjacent binding pins 20 due to the first aperture 40 is reduced, thereby avoiding the risk of short circuit between the adjacent binding pins 20 due to the residual of the conductive layer.

Figure 10:
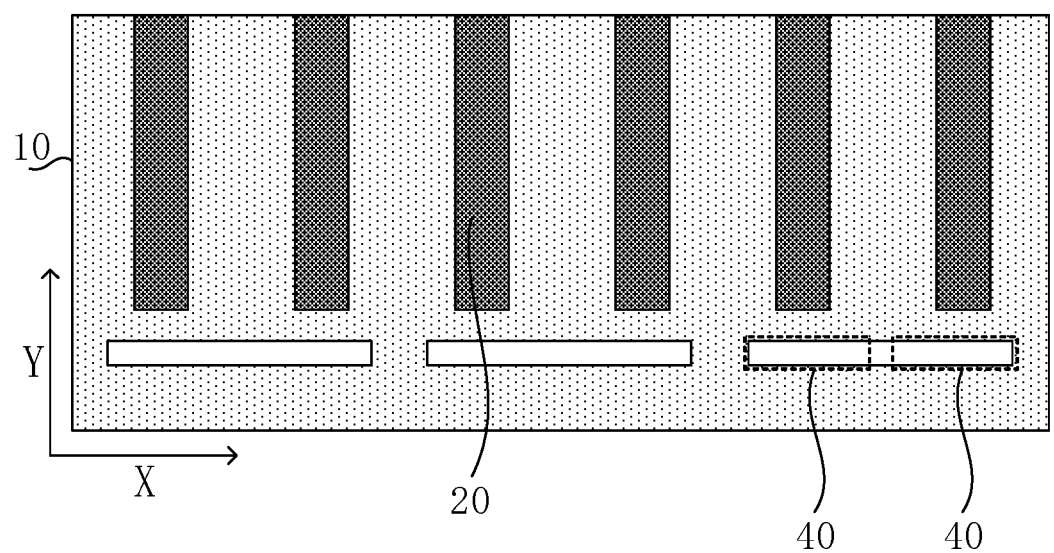
FIG. 10 is a partial enlarged view of the C1 region shown in FIG. 1 according to other embodiments of the present disclosure.
Figure 11:
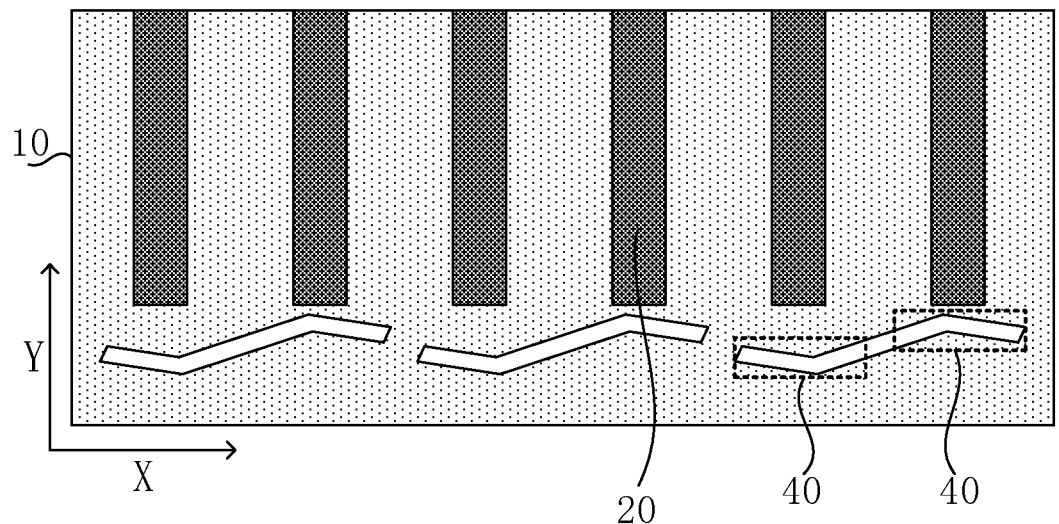
FIG. 11 is a partial enlarged view of the C1 region shown in FIG. 1 according to other embodiments of the present disclosure.
Figure 12:
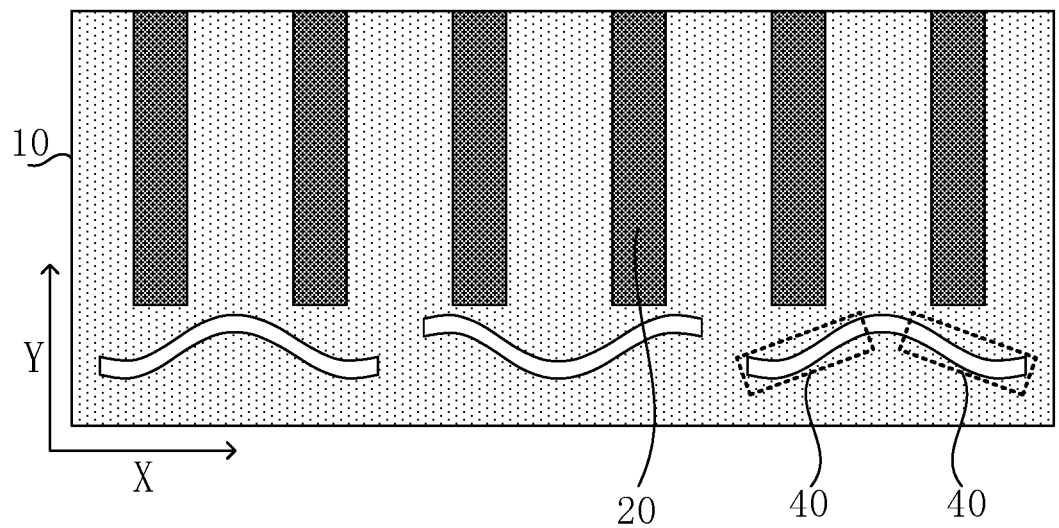
FIG. 12 is a partial enlarged view of the C1 region shown in FIG. 1 according to other embodiments of the present disclosure.
Figure 13:
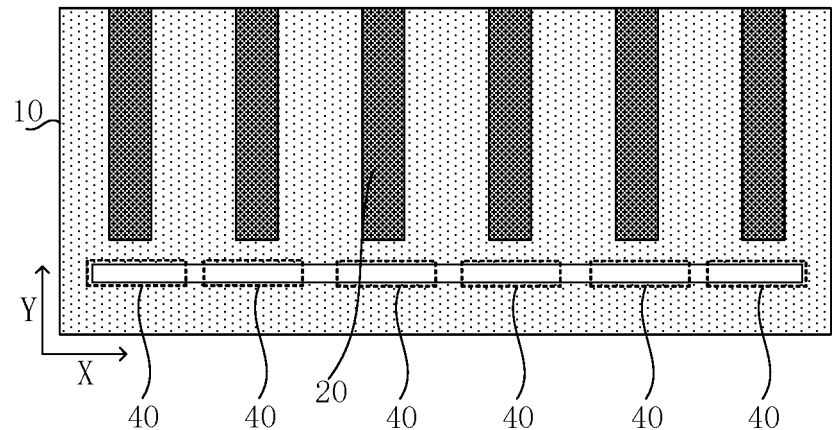
FIG. 13 is a partial enlarged view of the C1 region shown in FIG. 1 according to other embodiments of the present disclosure.
Figure 14:
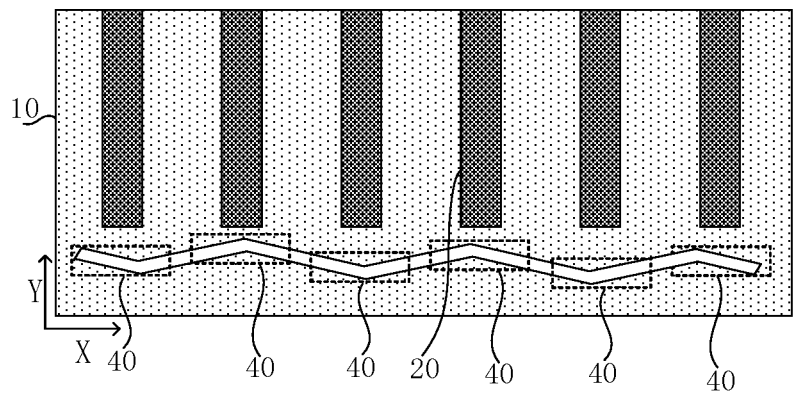
FIG. 14 is a partial enlarged view of the C1 region shown in FIG. 1 according to other embodiments of the present disclosure.
Figure 15:
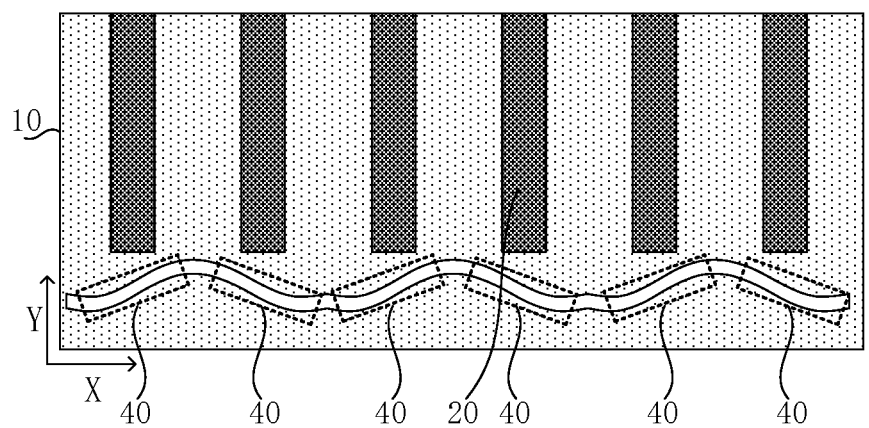
FIG. 15 is a partial enlarged view of the C1 region shown in FIG. 1 according to other embodiments of the present disclosure.

FIG. 10 is a partial enlarged view of the C1 region shown in FIG. 1 according to other embodiments of the present disclosure, FIG. 11 is a partial enlarged view of the C1 region shown in FIG. 1 according to other embodiments of the present disclosure, FIG. 12 is a partial enlarged view of the C1 region shown in FIG. 1 according to other embodiments of the present disclosure, FIG. 13 is a partial enlarged view of the C1 region shown in FIG. 1 according to other embodiments of the present disclosure, FIG. 14 is a partial enlarged view of the C1 region shown in FIG. 1 according to other embodiments of the present disclosure, and FIG. 15 is a partial enlarged view of the C1 region shown in FIG. 1 according to other embodiments of the present disclosure.

In some embodiments of the present disclosure, referring to FIG. 10 to FIG. 15, orthographic projections of at least two adjacent first apertures 40 in the second direction X on the substrate 10 communicate with each other. In some embodiments, at least two second apertures 40 arranged along the second direction X have a communicating structure. The at least two first apertures 40 whose orthographic projections communicate with each other overlap with the at least two binding pins 20 in the first direction Y.

By arranging the first apertures 40 whose orthographic projections communicate with each other, the cracking and warping of the insulating layer 30 in the first direction Y can be blocked from extending from the edge of the display panel to the binding pin 20.

In some embodiments, referring to FIG. 10 to FIG. 12, orthographic projections of some first apertures 40 that are adjacent to each other along the second direction X communicate with each other, and a gap is formed between the orthographic projections of some first apertures 40 that are adjacent to each other along the second direction X.

Exemplarily, as shown in FIG. 10 to FIG. 12, orthographic projections of every two first apertures 40 adjacent to each other along the second direction X communicate with each other, and a gap is formed between each of two first apertures 40 whose orthographic projections communicate with each other and another first aperture 40 adjacent to the first aperture.

In some embodiments, referring to FIG. 13 to FIG. 15, orthographic projections of first apertures 40 that are adjacent to each other along the second direction X communicate with one another, which can block cracking and warping at the edge of the display panel from extending toward the binding pins 20.

Figure 16:
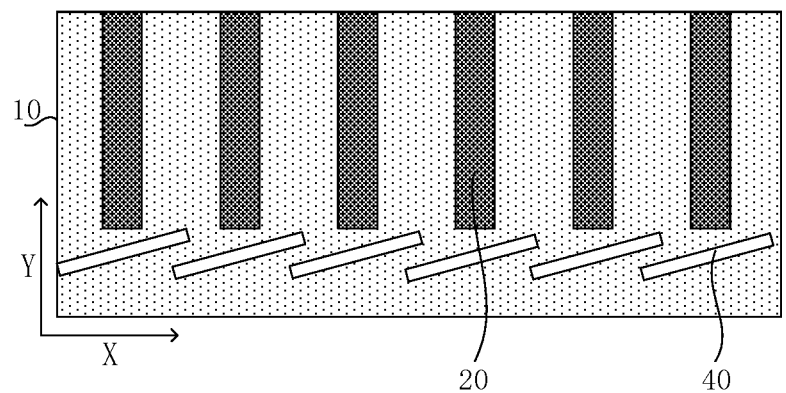
FIG. 16 is a partial enlarged view of the C1 region shown in FIG. 1 according to other embodiments of the present disclosure.
Figure 17:
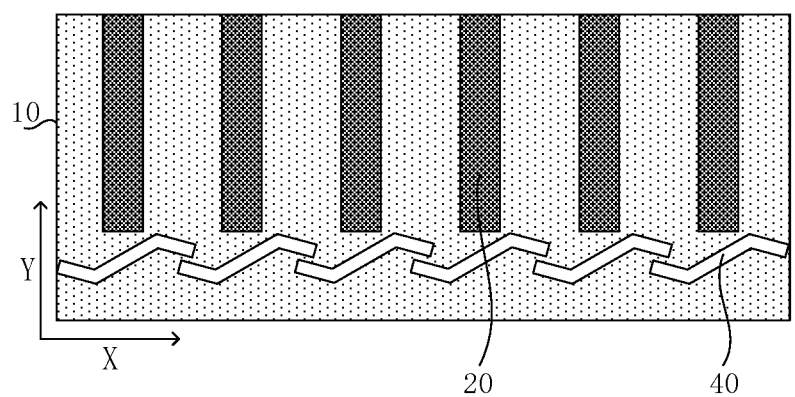
FIG. 17 is a partial enlarged view of the C1 region shown in FIG. 1 according to some embodiments of the present disclosure.
Figure 18:
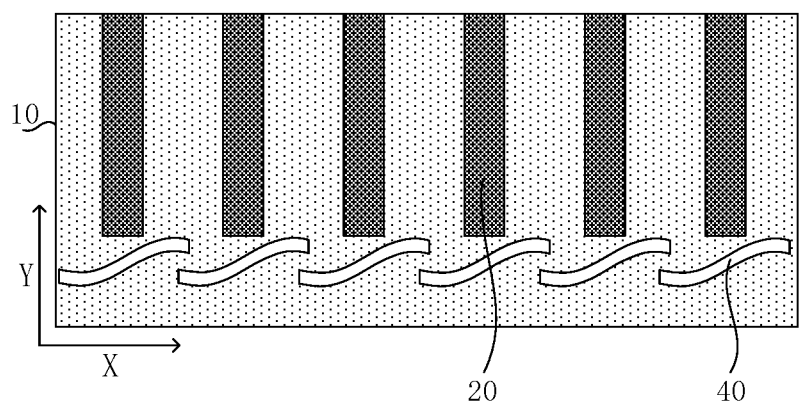
FIG. 18 is a partial enlarged view of the C1 region shown in FIG. 1 according to other embodiments of the present disclosure.

FIG. 16 is a partial enlarged view of the C1 region shown in FIG. 1 according to other embodiments of the present disclosure, FIG. 17 is a partial enlarged view of the C1 region shown in FIG. 1 according to some embodiments of the present disclosure, and FIG. 18 is a partial enlarged view of the C1 region shown in FIG. 1 according to other embodiments of the present disclosure.

In some embodiments of the present disclosure, as shown in FIG. 16 to FIG. 18, first apertures 40 adjacent to each other along the second direction X partially overlap in the first direction Y. That is, multiple second apertures 40 arranged along the second direction X do not communicate with each other, but two adjacent second apertures 40 overlap in the first direction Y.

Figure 9:
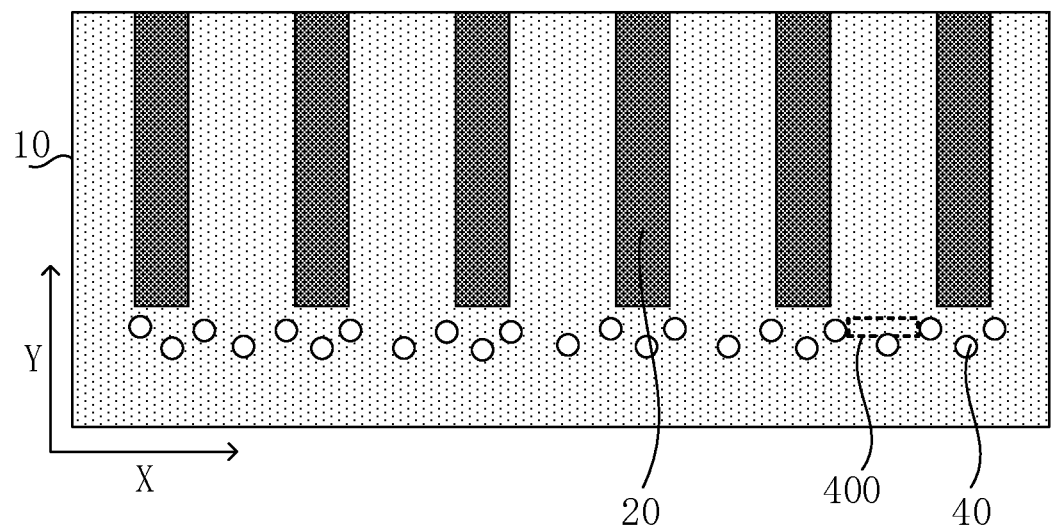
FIG. 9 is a partial enlarged view of the C1 region shown in FIG. 1 according to other embodiments of the present disclosure.

In the display panel provided by the present disclosure, the orthographic projection of the first aperture 40 on the substrate 10 has a shape of at least one of a broken line, a curved line, a straight line, or a point. For example, as shown in FIG. 6, FIG. 10, FIG. 13, and FIG. 16, the orthographic projection of the first aperture 40 on the substrate 10 has a shape of a straight line. As shown in FIG. 8, FIG. 12, FIG. 15, and FIG. 18, the orthographic projection of the first aperture 40 on the substrate 10 has a shape of a curved line. As shown in FIG. 7, FIG. 11, FIG. 14, and FIG. 17, the orthographic projection of the first aperture 40 on the substrate 10 on the substrate 10 has a shape of a broken line. As shown in FIG. 9, the orthographic projection of the first aperture 40 on the substrate 10 has a shape of a point.

In some embodiments, the orthographic projections of the first apertures 40 in the display panel on the substrate 10 can have one or more of the above shapes.

Figure 19:
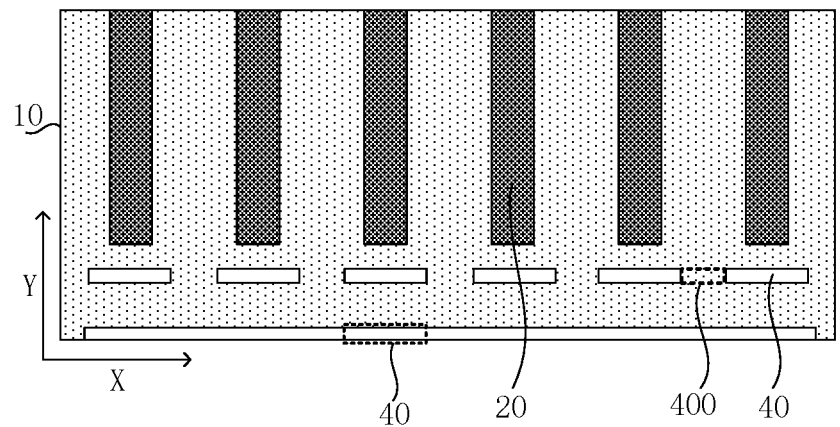
FIG. 19 is a partial enlarged view of the C1 region shown in FIG. 1 according to other embodiments of the present disclosure.

FIG. 19 is a partial enlarged view of the C1 region shown in FIG. 1 according to other embodiments of the present disclosure.

In some embodiments of the present disclosure, as shown in FIG. 19, an edge of at least one first aperture 40 away from the display region AA overlaps with at least one cut edge of the display panel. That is, the edge of the binding region B1 away from the display region AA overlaps with the at least one first aperture 40, so that the edge of the at least one first aperture 40 can be used as a knife feeding position when cutting the motherboard to form the display panel.

In some embodiments, the orthographic projections of the first apertures 40 on the substrate 10, which overlap with an edge of the binding region B1 away from the display region AA have a shape of a straight line. In some embodiments, the number of the first apertures 40 overlapping with the edge of the binding region B1 away from the display region AA is more than one, and the one or more first apertures 40 communicate with each other. These first apertures 40 form a large horizontal groove structure, which can reduce the risk of cracking and warping of the insulating layer at the edge of the display panel.

In some embodiments of the present disclosure, as shown in FIG. 19, multiple first apertures 40 arranged along the second direction X are regarded as an aperture group, and there are at least two aperture groups in the binding region B1 of the display panel.

Figure 20:
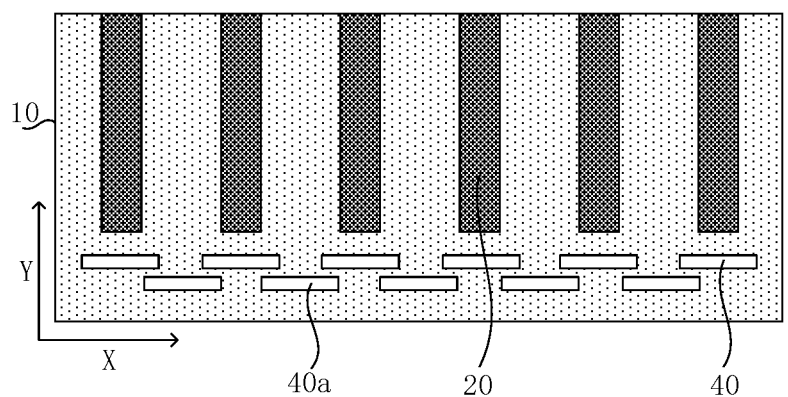
FIG. 20 is a partial enlarged schematic diagram of the C1 region in FIG. 1 according to other embodiments of the present disclosure.

FIG. 20 is a partial enlarged schematic diagram of the C1 region in FIG. 1 according to other embodiments of the present disclosure.

In some embodiments of the present disclosure, referring to FIG. 20, at least one insulating layer 30 of multiple insulating layers 30 includes at least one second aperture 40a, the second aperture 40a is provided at a side of the binding region B1 away from the display region AA, and there is at least one second aperture 40a in the insulating layer 30.

In some embodiments, an orthographic projection of the second aperture 40a on the substrate 10 overlap with an orthographic projection of a gap formed between adjacent binding pins 20 on the substrate 10 in the first direction Y. That is, along the first direction Y, the orthographic projection of at least a part of the second aperture 40a on the substrate 10 is located at a side of the gap between adjacent binding pins 20 away from the display region AA.

At least a part of the first aperture 40 is provided at a side of the binding pin 20 away from the display region AA, and at least a part of the second aperture 40a is provided in the gap between the binding pins 20, so that the first aperture 40 and the second aperture 40a can block the warping of the insulating layer of the display panel from extending along the first direction Y. Multiple first apertures 40 arranged along the second direction X can be dispersedly arranged to avoid the risk of electrical conduction between the binding pins 20 caused by the residue of the conductive layers close to the first aperture 40.

In some embodiments of the present disclosure, the at least one insulating layer 30 including the second apertures 40a is the at least one insulating layer 30 including the first apertures 40. That is, the first aperture 40 and the second aperture 40a can be simultaneously located in one of the insulating layers 30, and the first aperture 40 and the second aperture 40a can be simultaneously formed during the process of manufacturing the insulating layers 30.

For example, when the gate insulating layer 31/30 includes the first aperture 40, it can also include the second aperture 40a. When the intermediate insulating layer 32/32a includes the first aperture 40, it can also include the second aperture 40a. When the interlayer dielectric layer 32/32b includes the first aperture 40, it can also include the second aperture 40a. When the passivation layer 33/33a includes the first aperture 40, it can also include the second aperture 40a. When the planarization layer 33/33b includes the first aperture 40, it can also include the second aperture 40a.

In some embodiments, referring to FIG. 20, orthographic projections of the first apertures 40 on the substrate 10 and orthographic projections of the second apertures 40a on the substrate 10 are arranged alternately along the first direction X.

Figure 21:
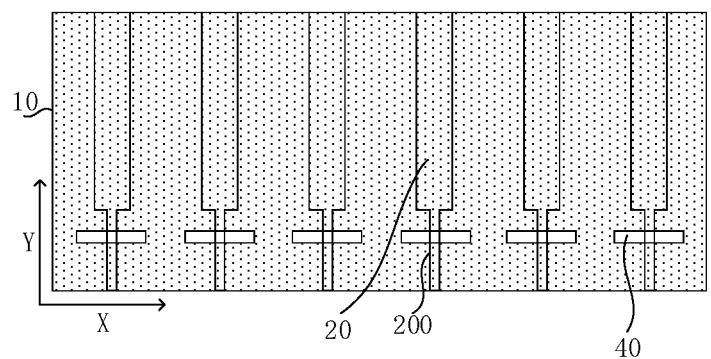
FIG. 21 is a partial enlarged schematic diagram of the C1 region in FIG. 1 according to other embodiments of the present disclosure.

FIG. 21 is a partial enlarged schematic diagram of the C1 region in FIG. 1 according to other embodiments of the present disclosure.

In some embodiments of the present disclosure, referring to FIG. 21, the display panel includes multiple pull-down metal lines 200, and the pull-down metal line 200 is located at a side of the binding pin 20 away from the display region AA and is connected to the binding pin 20. The pull-down metal line 200 and the binding pin 20 can be formed into one piece.

In a direction perpendicular to the plane of the substrate 10, as shown in FIG. 21, the first aperture 40 overlaps with the pull-down metal line 200. That is, along the thickness direction Z of the display panel, the first aperture 40 overlaps with the pull-down metal line 200. Generally, the pull-down metal line 200 and the binding pin 20 are formed into one piece, and a portion where the first aperture 40 and the pull-down metal line 200 overlap can be a position where the stress applied on the pull-down metal line 200 is released, thereby blocking the cracking and warping of pull-down metal line 200 from extending toward the binding pin 20.

In some embodiments where the display panel includes the second apertures 40a, the second aperture 40a is located between adjacent pull-down metal lines 200 in the second direction X.

Figure 22:
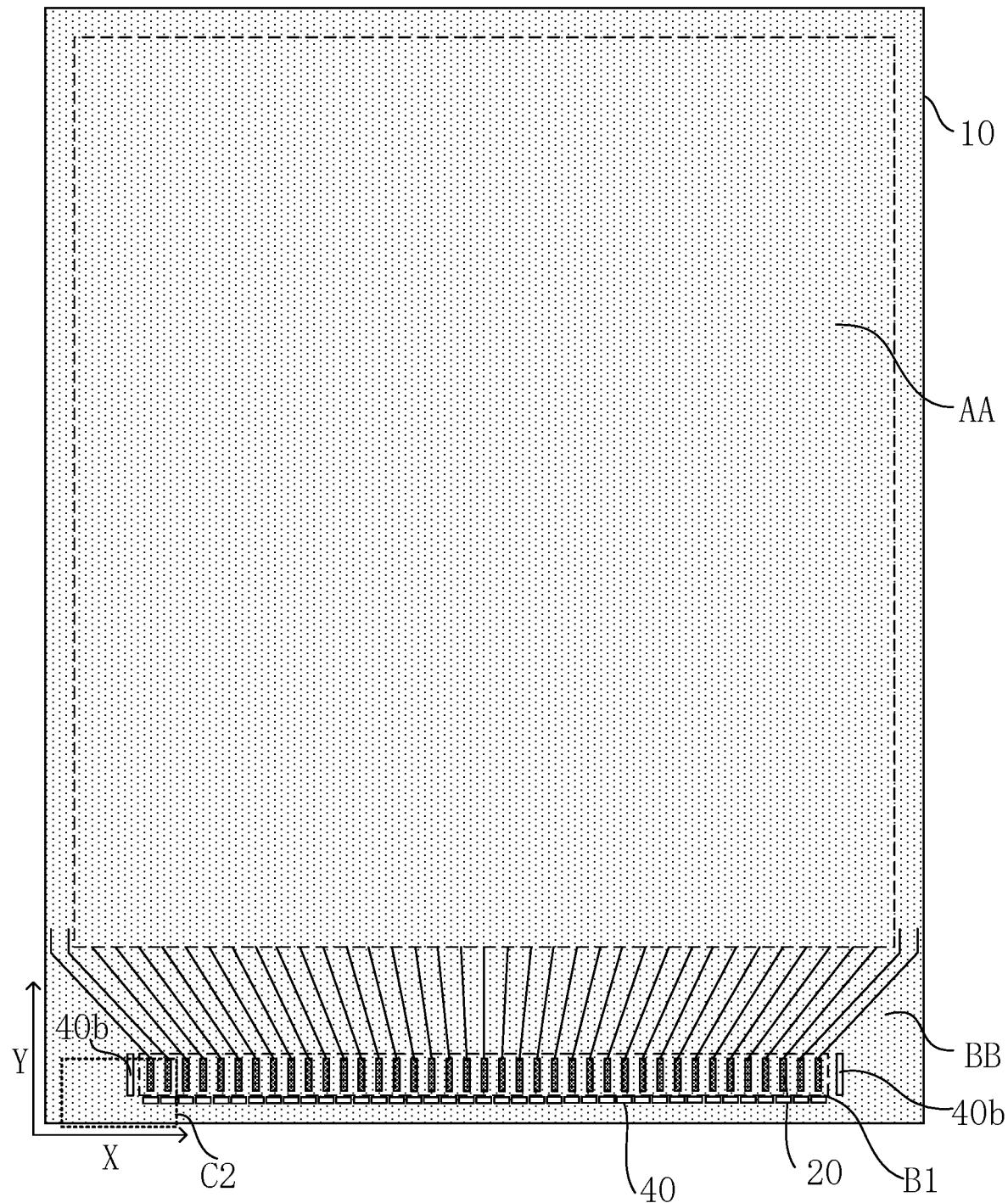
FIG. 22 is a schematic diagram of a display panel according to other embodiments of the present disclosure.

FIG. 22 is a schematic diagram of a display panel according to other embodiments of the present disclosure, and FIG.

23 is a partial enlarged schematic view of the C2 region in FIG. 22 according to other embodiments of the present disclosure.

Figure 23:
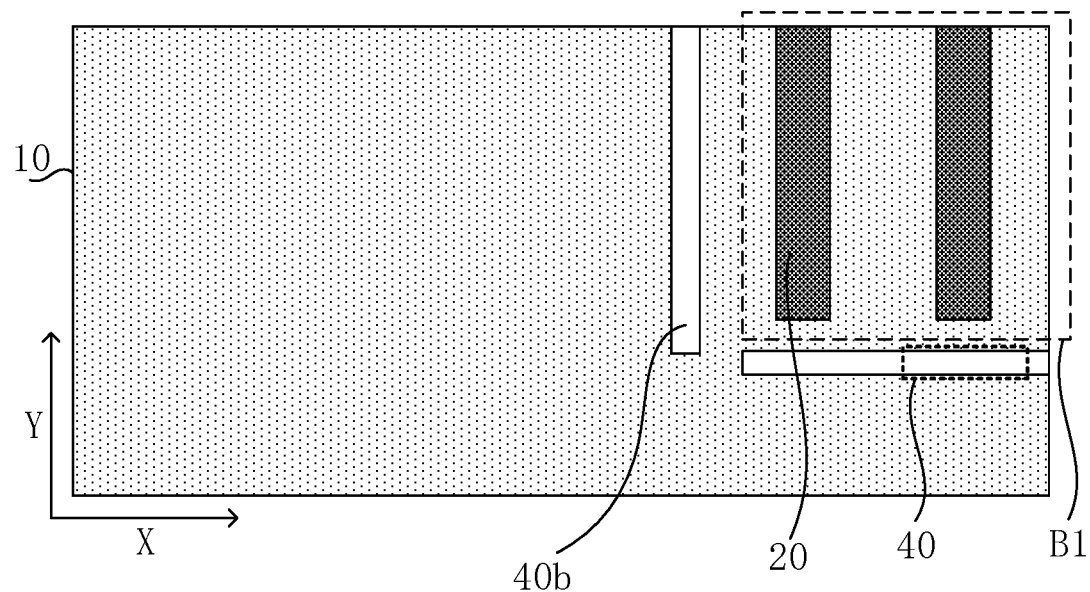
FIG. 23 is a partial enlarged schematic view of the C2 region in FIG. 22 according to other embodiments of the present disclosure.

Referring to FIG. 22 and FIG. 23, multiple binding pins 20 in the display panel are arranged along the second direction X, and at least one insulating layer 30 of multiple insulating layers 30 includes at least one third aperture 40b. The third aperture 40b and the binding pin 20 are arranged along the second direction X.

Exemplarily, the second direction X is parallel to a row direction, multiple binding pins 20 in the binding region B1 are arranged along the row direction, and the third aperture 40b and the binding pin 20 are arranged along the row direction.

In some embodiments of the present disclosure, with the third aperture 40b, the cracking and warping of the display panel can be blocked from extending toward the binding pin 20 along a direction substantially same as the second direction X.

In some embodiments, the insulating layer 30 including the third aperture 40b can be the insulating layer 30 including the first aperture 40, or can be the insulating layer 30 including the second aperture 40a. That is, the first aperture 40 and the third aperture 40b can be simultaneously located in one of the multiple insulating layers 30, or the second aperture 40a and the third aperture 40b can be simultaneously located in one of the multiple insulating layers 30.

For example, when the gate insulating layer 31/30 includes the first aperture 40, it can also include the third aperture 40b. When the intermediate insulating layer 32/32a includes the first aperture 40, it can also include the third aperture 40b. When the interlayer dielectric layer 32/32b includes the first aperture 40, it can also include the third aperture 40b. When the passivation layer 33/33a includes the first aperture 40, it can also include the third aperture 40b. When the planarization layer 33/33b includes the first aperture 40, it can also include the third aperture 40b.

Figure 24:
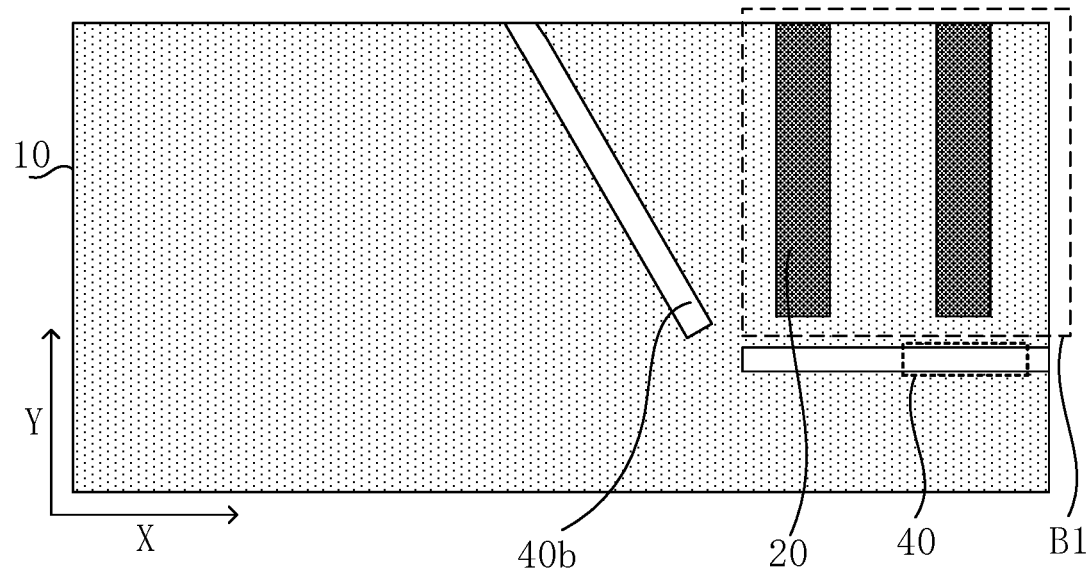
FIG. 24 is a partial enlarged schematic view of the C2 region in FIG. 22 according to other embodiments of the present disclosure.

FIG. 24 is a partial enlarged schematic view of the C2 region in FIG. 22 according to other embodiments of the present disclosure.

In some embodiments, as shown in FIG. 22 to FIG. 24, the third aperture 40b is located out of the binding region B1. That is, if the binding pins 20 are regarded as a whole, the third apertures 40b that are arranged along the second direction X with the binding pins 20 is located out of the whole, so that the third apertures 40b are located out of all the binding pins 20. In some embodiments, along the second direction X, cracking and warping out of the binding region B1 can be blocked outside the binding region B1 by the third apertures 40b.

Referring to FIG. 22 and FIG. 23, the third aperture 40b extends along the first direction Y. In some embodiments, the first aperture 40 substantially extends along the second direction X, so that the first aperture 40 and the third aperture 40b extend in different directions that are perpendicular to each other, and the cooperation of the first aperture 40 and the third aperture 40b can block the warping of the binding pin 20 to extend.

Referring to 24, the third aperture 40b extends along a third direction, and the third direction intersects with the first direction Y and the second direction X.

Figure 25:
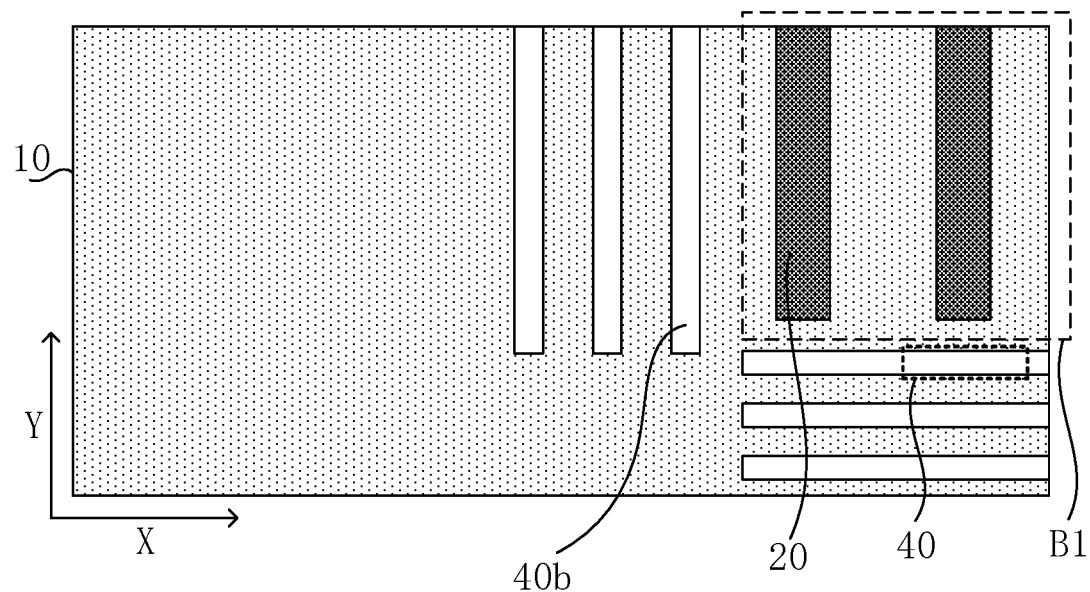
FIG. 25 is a partial enlarged schematic view of the C2 region in FIG. 22 according to other embodiments of the present disclosure.
Figure 26:
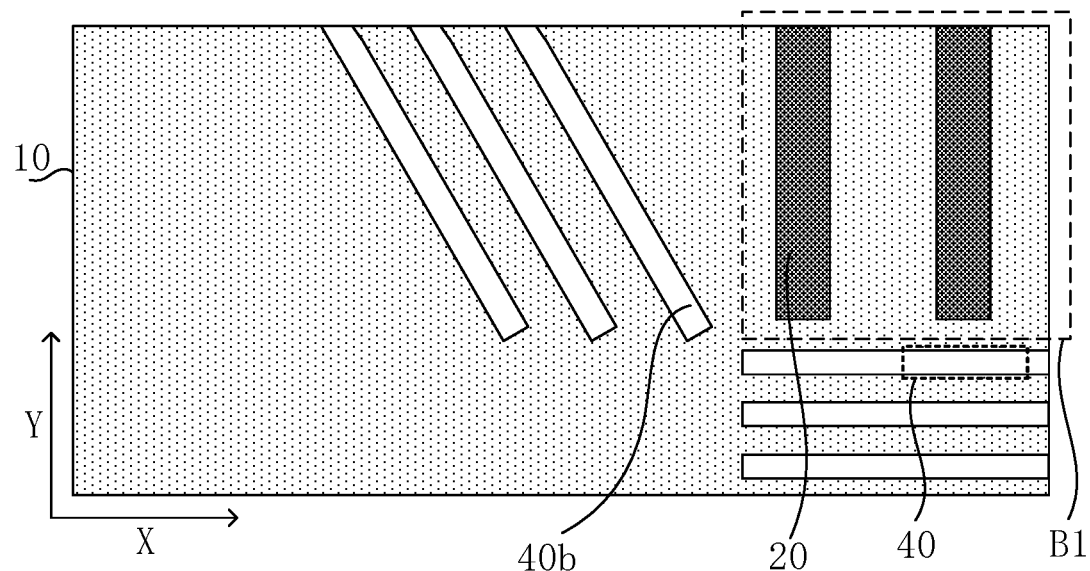
FIG. 26 is a partial enlarged schematic view of the C2 region in FIG. 22 according to other embodiments of the present disclosure.

FIG. 25 is a partial enlarged schematic view of the C2 region in FIG. 22 according to other embodiments of the present disclosure, and FIG. 26 is a partial enlarged schematic view of the C2 region in FIG. 22 according to other embodiments of the present disclosure.

In some embodiments of the present disclosure, as shown in FIG. 25 and FIG. 26, among multiple first apertures 40 located above the substrate 10, at least two first apertures 40 can be arranged along the first direction Y; among multiple third apertures 40b located above the substrate 10, at least two third apertures 40b can be arranged along the first direction Y. In some embodiments, when multiple second apertures 40a are located above the substrate 10, among the multiple second apertures 40a, at least two second apertures 40a are arranged along the second direction X.

Figure 27:
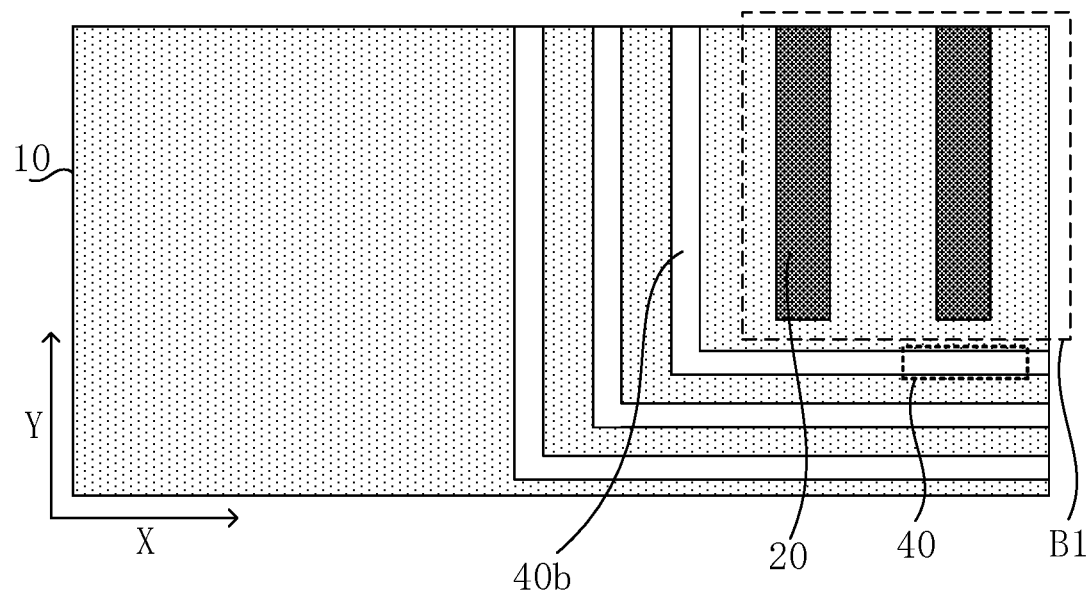
FIG. 27 is a partial enlarged schematic view of the C2 region in FIG. 22 according to other embodiments of the present disclosure.
Figure 28:
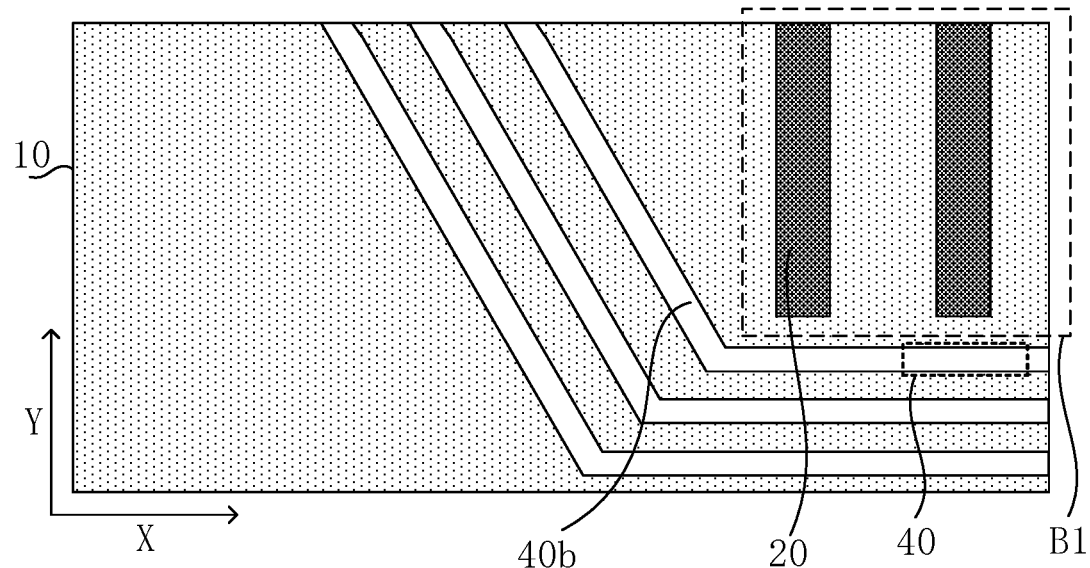
FIG. 28 is a partial enlarged schematic view of the C2 region in FIG. 22 according to other embodiments of the present disclosure.

FIG. 27 is a partial enlarged schematic view of the C2 region in FIG. 22 according to other embodiments of the present disclosure, and FIG. 28 is a partial enlarged schematic view of the C2 region in FIG. 22 according to other embodiments of the present disclosure.

In some embodiments of the present disclosure, as shown in FIG. 27 and FIG. 28, an orthographic projection of at least one third aperture 40b on the substrate 10 communicates with an orthographic projection of at least one first aperture 40 on the substrate 10.

In some embodiments, multiple first apertures 40 arranged along the second direction X communicates with each other, and then communicate with the third apertures 40b, so that the first apertures 40 and the third apertures 40b form a structure for semi-enclosing the binding pins in the binding region B1, so that the first apertures 40 and the third apertures 40b can jointly block the cracking and apertures in the insulating layer 30 from extending toward the binding pins 20 along each of the first direction Y and the second direction X.

Figure 29:
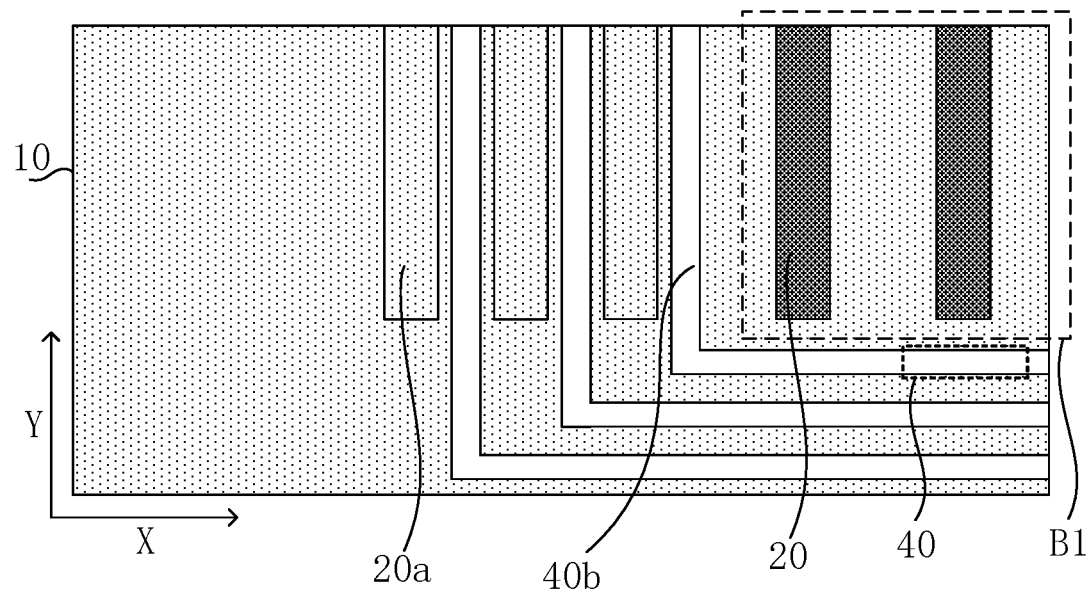
FIG. 29 is a partial enlarged schematic view of the C2 region in FIG. 22 according to other embodiments of the present disclosure.
Figure 30:
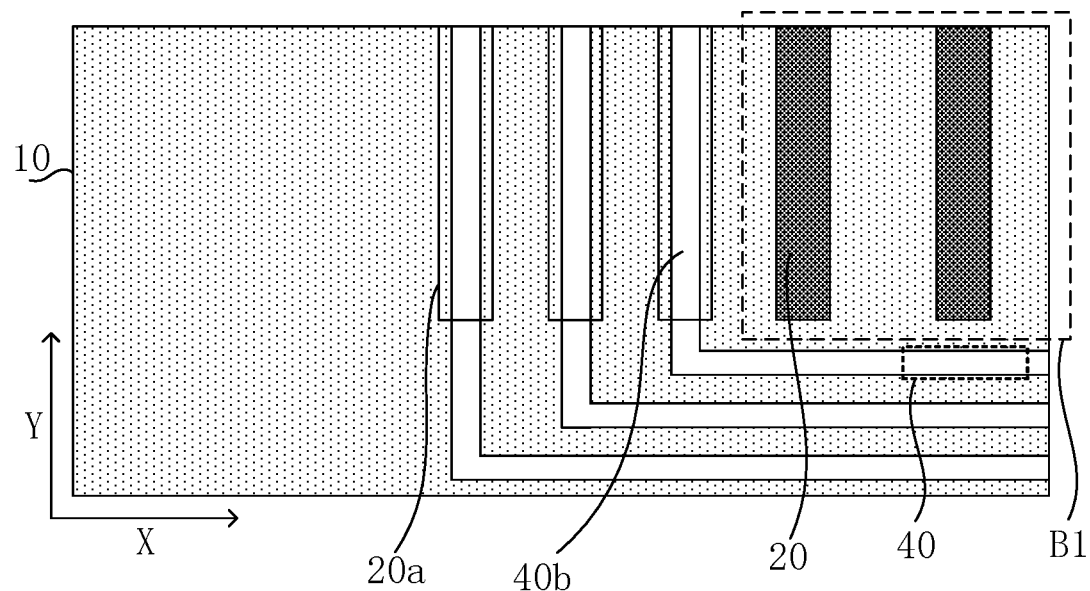
FIG. 30 is a partial enlarged schematic view of the C2 region in FIG. 22 according to other embodiments of the present disclosure.
Figure 31:
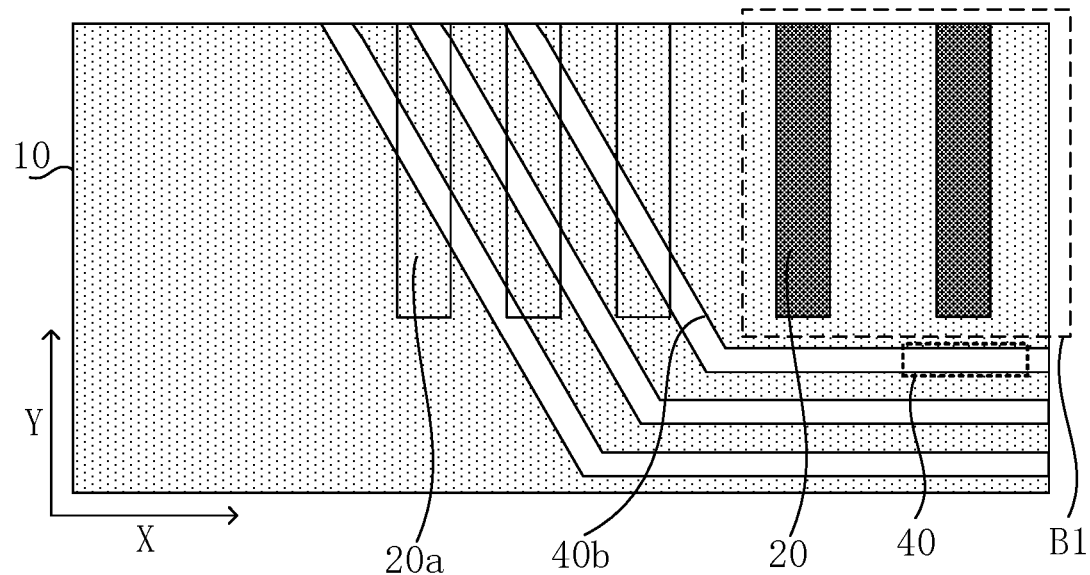
FIG. 31 is a partial enlarged schematic view of the C2 region in FIG. 22 according to other embodiments of the present disclosure.

FIG. 29 is a partial enlarged schematic view of the C2 region in FIG. 22 according to other embodiments of the present disclosure, FIG. 30 is a partial enlarged schematic view of the C2 region in FIG. 22 according to other embodiments of the present disclosure, and FIG. 31 is a partial enlarged schematic view of the C2 region in FIG. 22 according to other embodiments of the present disclosure.

In some embodiments of the present disclosure, as shown in FIG. 29 to FIG. 31, the display panel includes multiple dummy pins, and the multiple dummy pins include a first dummy pin 20a located at a side of the binding region B1 away from the binding pin 20. In some embodiments, the dummy pin and the binding pin 20 can be manufactured simultaneously. That is, the dummy pin and the binding pin are formed of a same conductive layer.

If the dummy pin is bound to and welded to neither the integrated circuit board nor the flexible circuit board, the dummy pin can bear part of the binding stress in the process of binding and welding the binding pins 20 to the integrated circuit board and the flexible circuit board, thereby reducing the cracking and warping of the layers caused by the binding stress.

In some embodiments, as shown in FIG. 29, an orthographic projection of the third aperture 40b on the substrate 10 is located between orthographic projections of adjacent first dummy pins 20a on the substrate 10. That is, the third aperture 40b is located in a part of one insulating layer 30 that is located between adjacent first dummy pins 20a.

In some embodiments, as shown in FIG. 30 and FIG. 31, in the direction Z perpendicular to the plane of the display panel, the first dummy pin 20a overlaps with the third aperture 40b. That is, the third aperture 40b is located in a part of one insulating layers 30 where the first dummy pin 20a is located.

Figure 32:
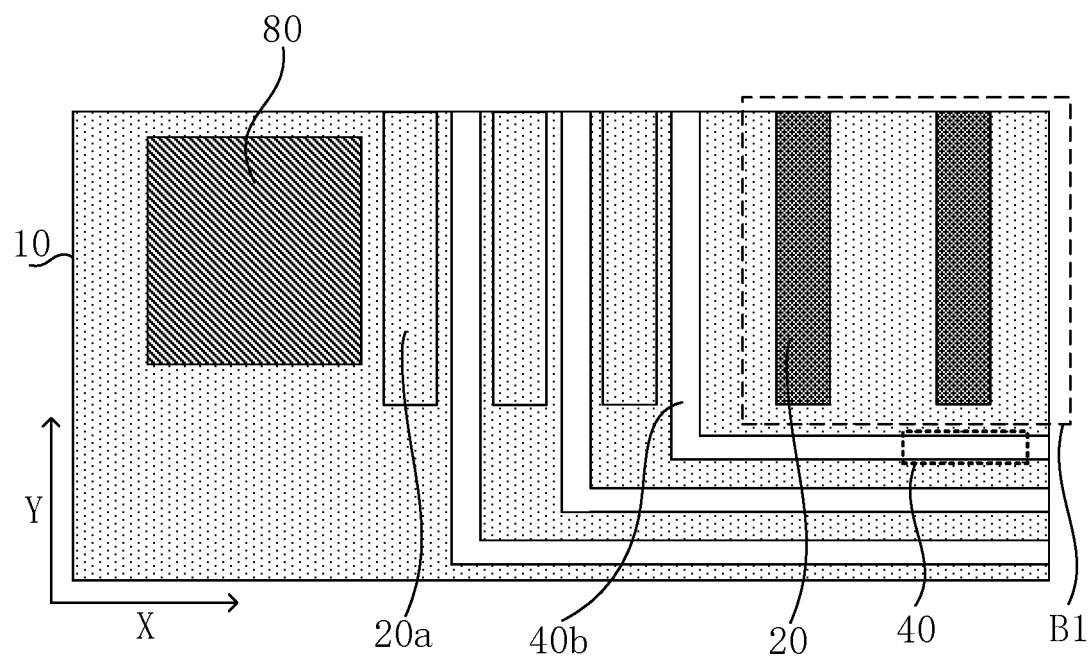
FIG. 32 is a partial enlarged schematic view of the C2 region in FIG. 22 according to other embodiments of the present disclosure.
Figure 33:
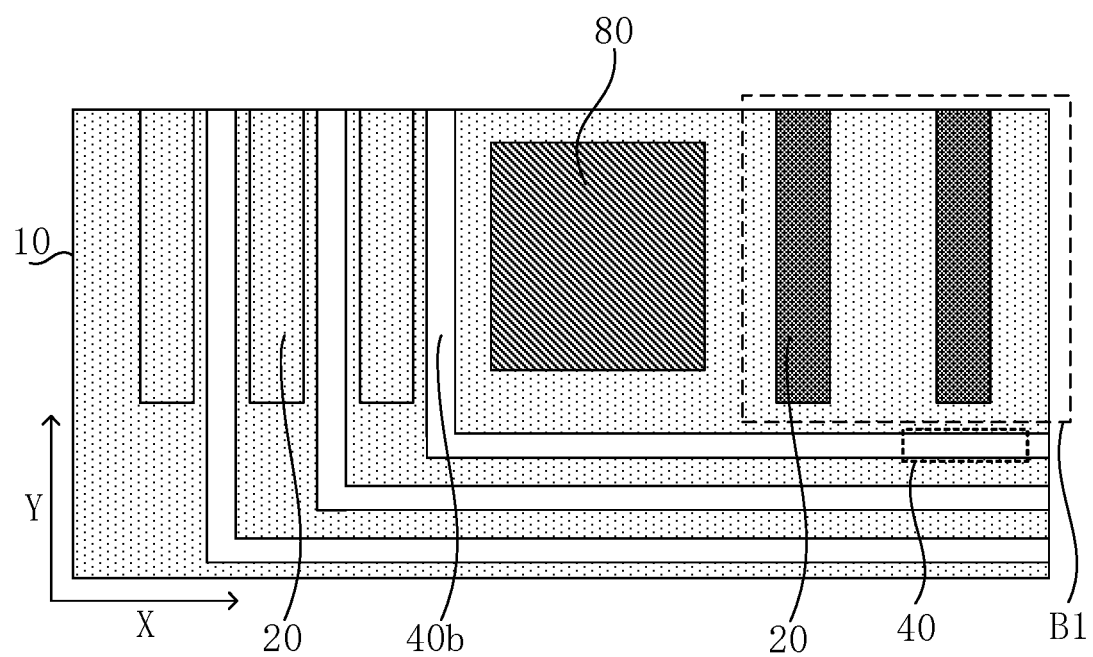
FIG. 33 is a partial enlarged schematic view of the C2 region in FIG. 22 according to other embodiments of the present disclosure.

FIG. 32 is a partial enlarged schematic view of the C2 region in FIG. 22 according to other embodiments of the present disclosure, and FIG. 33 is a partial enlarged schematic view of the C2 region in FIG. 22 according to other embodiments of the present disclosure.

In some embodiments of the present disclosure, as shown in FIG. 32 and FIG. 33, the display panel includes an alignment block 80 serving as an alignment mark when the display panel is bound to other tools or devices.

In some embodiments, as shown in FIG. 32, the third aperture 40b can be located between the alignment block 80 and the binding pin 20. That is, along the second direction X, the region where the third aperture 40b is located is located between the region where the alignment block 80 is located and the region where the binding pin 20 is located.

In some embodiments, as shown in FIG. 33, the alignment block 80 can be located between the third aperture 40b and the binding pin 20. That is, along the second direction X, the region where the alignment block 80 is located is located between the region where the third aperture 40b is located and the region where the binding pin 20 is located.

Figure 34:
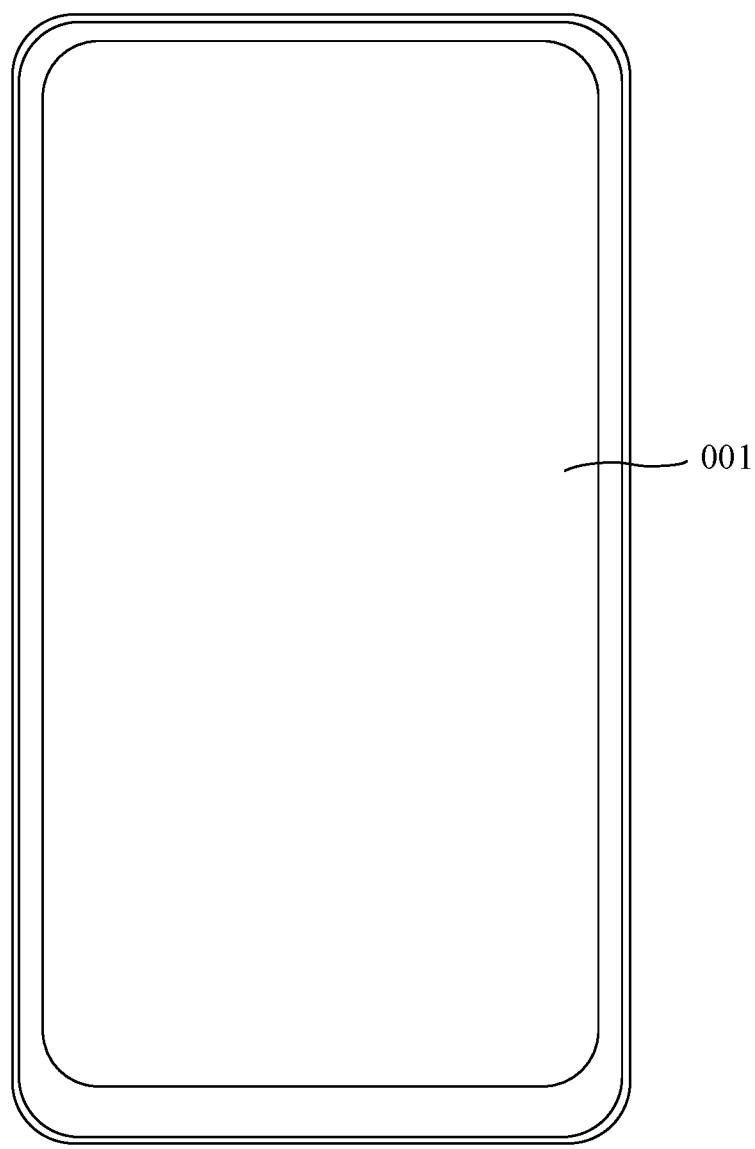
FIG. 34 is a schematic diagram of a display apparatus according to some embodiments of the present disclosure.

FIG. 34 is a schematic diagram of a display apparatus according to some embodiments of the present disclosure.

The present disclosure provides a display apparatus. As shown in FIG. 34, the display apparatus includes a display panel 001 provided in any one of the above embodiments. The display apparatus can be a mobile phone. In other embodiments, the display apparatus can be a computer or a TV.

In the embodiments of the present disclosure, the first apertures 40 in the insulating layers 30 is provided in the region of the binding pin 20 away from the display region AA, so that the first aperture 40 can block the cracking and warping at the edge of the display panel from extending toward the binding pins 20, thereby ensuring the flatness of the binding pins 20, and thus improving the yield of binding between the display panel and the integrated circuit board/the flexible circuit board in the display apparatus.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising:
a substrate having a display region and a binding region that are arranged along a first direction;
a plurality of binding pins arranged along a second direction, wherein the plurality of binding pins is provided on a side of the substrate and located in the binding region of the substrate, and wherein the first direction intersects with the second direction; and
a plurality of insulating layers arranged on a same side of the substrate as the plurality of binding pins,
wherein at least one insulating layer of the plurality of insulating layers each comprises at least one first aperture provided at a side of the binding region away from the display region; and wherein an orthographic projection of one of the at least one first aperture on the substrate overlaps with an orthographic projection of one of the plurality of binding pins on the substrate in the first direction; and
wherein an edge of one of the at least one first apertures away from the display region overlaps with at least one cut edge of the display panel.

2. The display panel according to claim 1, wherein, in a direction perpendicular to a plane of the display panel, the at least one insulating layer each comprising the at least one first aperture is an inorganic layer and is located between the substrate and a layer of the plurality of binding pins.

3. The display panel according to claim 1, wherein at least two insulating layers of the plurality of insulating layers each comprise the at least one first aperture; and in a direction perpendicular to a plane of the display panel, the first apertures located in different insulating layers of the at least two insulating layers overlap with each other; and
one of the at least two insulating layers each comprising the at least one first aperture is located between the substrate and a layer of the plurality of binding pins, and another one of the at least two insulating layers each comprising the at least one first aperture is located at a side of the layer of the plurality of binding pins away from the substrate.

4. The display panel according to claim 1, wherein at least one insulating layer of the plurality of insulating layers each comprises a plurality of first apertures arranged along the second direction; and
an orthographic projection of a gap between adjacent first apertures, arranged along the second direction, of the plurality of first apertures on the substrate is located between orthographic projections of adjacent binding pins of the plurality of binding pins on the substrate.

5. The display panel according to claim 1, wherein the at least one first aperture comprises at least two first apertures, and along the first direction, orthographic projections of the at least two first apertures adjacent to one another along the second direction on the substrate overlap with each other; and/or, the at least one insulating layer comprises at least two insulating layers, and along the first direction, orthographic projections of at least two first apertures of the at least two insulating layers are adjacent to one another along the second direction on the substrate and overlap with each other.

6. The display panel according to claim 1, wherein the at least one first aperture comprises at least two first apertures and orthographic projections of the at least two first apertures adjacent to one another along the second direction communicate with each other; and/or, the at least one insulating layer comprises at least two insulating layers and orthographic projections of at least two first apertures of the at least two first apertures are adjacent to one another along the second direction and communicate with each other.

7. The display panel according to claim 6, wherein the at least one first aperture comprises at least two first apertures and orthographic projections of the at least two first apertures adjacent to each other along the second direction communicate with each other; and/or, the at least one insulating layer comprises at least two insulating layers and orthographic projections of all first apertures of the at least two first apertures are adjacent to one another along the second direction and communicate with each other.

8. The display panel according to claim 1, wherein the orthographic projection of the one of the at least one first aperture on the substrate has a shape of at least one of a broken line, a curved line, a straight line, or a point.

9. The display panel according to claim 1, wherein a gate insulating layer, an interlayer dielectric layer, an insulating intermediate layer, a passivation layer, and a planarization layer are provided on a side of the substrate; and
the at least one insulating layer each comprising the at least one first aperture is at least one of the gate insulating layer, the interlayer dielectric layer, the insulating intermediate layer, the passivation layer, or the planarization layer.

10. The display panel according to claim 1, further comprising:
a plurality of pull-down metal lines, one of which is located on a side of one binding pin of the plurality of binding pins away from the display region and is connected to the one binding pin,
wherein one of the at least one first aperture overlaps with the one of the plurality of pull-down metal lines in a direction perpendicular to a plane of the substrate.

11. The display panel according to claim 1, wherein at least one of the plurality of insulating layers each comprises at least one second aperture provided at a side of the binding region away from the display region; and
in the first direction, an orthographic projection of one of the at least one second aperture on the substrate overlaps with an orthographic projection of a gap between adjacent ones of the plurality of binding pins on the substrate.

12. The display panel according to claim 11, wherein an orthographic projection of the at least one first aperture on the substrate and an orthographic projection of the at least one second aperture on the substrate are arranged alternately along the first direction.

13. The display panel according to claim 11, further comprising:
a plurality of pull-down metal lines, one of which is located at a side of one binding pin of the plurality of binding pins away from the display region and is connected to the one binding pin,
wherein one of the at least one second aperture is located between adjacent ones of the plurality of pull-down metal lines in the second direction.

14. The display panel according to claim 11, wherein one of the at least one insulating layer each comprising the at least one second aperture is one of the at least one insulating layer each comprising the at least one first aperture.

15. The display panel according to claim 1, wherein the plurality of binding pins is arranged along the second direction; and
at least one insulating layer of the plurality of insulating layers comprises at least one third aperture, and one of the at least one third aperture and one of the plurality of binding pins are arranged in the second direction.

16. The display panel according to claim 15, wherein the at least one third aperture is located out of the binding region; and
each of the at least one third aperture extends in a third direction, and the third direction intersects with each of the first direction and the second direction.

17. The display panel according to claim 15, wherein each of the at least one third aperture extends along the first direction.

18. The display panel according to claim 15, wherein an orthographic projection of one of the at least one third aperture on the substrate communicates with an orthographic projection of one of the at least one first aperture on the substrate.

19. The display panel according to claim 15, further comprising:
a plurality of dummy pins comprising first dummy pins located at a side of the binding region away from the plurality of binding pins,
wherein an orthographic projection of one of the at least one third aperture on the substrate is located between orthographic projections of adjacent ones of the first dummy pins on the substrate.

20. The display panel according to claim 15, further comprising:
a plurality of dummy pins comprising a first dummy pin located at a side of the binding region away from one of the plurality of binding pins,
wherein in a direction perpendicular to a plane of the display panel, the first dummy pin overlaps with one of the at least one third aperture.

21. The display panel according to claim 15, further comprising:
an alignment block, wherein one of the at least one third aperture is located between the alignment block and the binding pin, or, the alignment block is located between one of the at least one third aperture and one of the plurality of binding pins.

22. The display panel according to claim 15, wherein the at least one insulating layer each comprising the at least one third aperture is the at least one insulating layer each comprising the at least one first aperture.

23. A display apparatus, comprising a display panel, wherein the display panel comprises:
a substrate having a display region and a binding region that are arranged along a first direction;
a plurality of binding pins arranged along a second direction, wherein the plurality of binding pins is provided on a side of the substrate and located in the binding region of the substrate, and the first direction intersects with the second direction; and
a plurality of insulating layers arranged on a same side of the substrate as the plurality of binding pins,
wherein at least one insulating layer of the plurality of insulating layers each comprises at least one first aperture provided at a side of the binding region away from the display region; and an orthographic projection of one of the at least one first aperture on the substrate overlaps with an orthographic projection of one of the plurality of binding pins on the substrate in the first direction; and
wherein an edge of one of the at least one first apertures away from the display region overlaps with at least one cut edge of the display panel.

* * * * *